(12) United States Patent
Lin

(10) Patent No.: US 6,215,839 B1
(45) Date of Patent: Apr. 10, 2001

(54) LOW JITTER FRACTIONAL DIVIDER WITH LOW CIRCUIT SPEED CONSTRAINT

(75) Inventor: Wen-Chang Lin, Hsinchu Hsien (TW)

(73) Assignee: Sunplus Technology Co., Ltd., Hsin-Chu (TW)

( * ) Notice: Subject to any disclaimer, the term of this patent is extended or adjusted under 35 U.S.C. 154(b) by 0 days.

(21) Appl. No.: 09/441,044

(22) Filed: Nov. 16, 1999

(51) Int. Cl.$^7$ ...................................................... G06M 3/00
(52) U.S. Cl. ................................................. 377/48; 377/28
(58) Field of Search ......................................... 377/48, 28

*Primary Examiner*—Margaret R. Wambach
(74) *Attorney, Agent, or Firm*—Bacon & Thomas, PLLC

(57) ABSTRACT

A low jitter fractional divider with low circuit speed constraint is disclosed, which lowers the frequency of a high frequency clock signal to perform a fraction division in the condition of low frequency. A compensation circuit, which has an adjust buffer and a down-counter, is provided for adjusting the output clock signal of the fractional divider to have a jitter substantially equal to the jitter occurred in high frequency, such that a low jitter can be achieved without being limited by the circuit speed.

11 Claims, 4 Drawing Sheets

| countZ | adjust | cka | adjusted | DOWN COUN-TER LOAD VALUE | adjusted (AFTER LOAD) | cka (AFTER LOAD) |
|---|---|---|---|---|---|---|
| HIGH | HIGH | LOW | LOW | ∅ | HIGH | UNCHANGED |
| HIGH | × | LOW | HIGH | countH | LOW | HIGH |
| HIGH | × | HIGH | × | countL | UNCHANGED | LOW |

FIG.2

LOW JITTER FRACTIONAL DIVIDER WITH LOW CIRCUIT SPEED CONSTRAINT

BACKGROUND OF THE INVENTION

1. Field of the Invention

The present invention relates to a fractional divider and, more particularly, to a low jitter fractional divider with low circuit speed constraint.

2. Description of Related Art Conventionally, a fractional divider is provided to divide the frequency of a clock signal by a fraction number "b/a", wherein b>a. Such a fractional divider is implemented by employing an accumulator to add the value of "a" to the value stored in the accumulator in each operation cycle. The accumulated value is compared with the value of "b". In case of a>b, the accumulated value is subtracted by the value of "b" and re-stored to the accumulator, and an overflow flag is generated. Otherwise, the accumulated value is simply re-stored to the accumulator. This overflow flag is provided to be the output of the fractional divider. FIG. 4 shows that such a fractional divider 41 is used to divide a clock signal "ck" by 5/3 to generate a divided clock signal "ck'". Based on the operating manner of the fractional divider 41 as described above, a timing diagram is obtained, which illustrates that five continuous pulses of the clock signal "ck" are applied to the fractional divider 41 to generate three continuous pulses of clock signal "ck'". Therefore, a divide-by-5/3 operation is performed. However, the pulses of the clock signal "ck'" generated by the fractional divider 41 are not uniformly distributed, which is known as a jitter phenomenon in the art. Such jitter is especially obvious if the clock frequency to be divided is low. To overcome this jitter problem, the conventional technique employs a high frequency base clock signal and an accumulator for implementing a fractional divider to obtain a low jitter clock signal. However, when the stages of the accumulators are increased and the frequency of the base clock signal goes higher, the accumulator will not be able to finish the required accumulation operation in a short operation cycle, due to the limitation imposed by the current integrated circuit manufacturing process. Accordingly, a bottleneck is encountered with the increase of a clock signal. In addition, it may be applicable to reduce the frequency of a high-frequency clock signal prior to performing the fractional division operation, thereby avoiding the bottleneck. Unfortunately, this will increase the jitter as described above. Therefore there is a need to have a fractional divider which can mitigate and/or obviate the aforementioned problems.

SUMMARY OF THE INVENTION

The object of the present invention is to provide a low jitter fractional divider with low circuit speed constraint, which is triggered by a clock signal with a relatively low frequency to perform a fractional division process, such that the bottleneck in circuit speed can be eliminated and a low jitter as achieved in a high frequency fractional division process can be maintained.

To achieve the object, the low jitter fractional divider with low circuit speed constraint in accordance with the present invention includes a divider, a fractional divider, and a compensation circuit. The divider is provided to divide the frequency of an input first clock signal by an integer number c to obtain a second clock signal. The fractional divider divides the frequency of the second clock signal by a fraction number b/a to obtain an output voltage signal. The compensation circuit has an adjust buffer and a down-counter for receiving the output voltage signal to generate an output clock signal with low jitter. The adjust buffer generates an adjust signal based on the output voltage signal and the feedback of the output clock signal, wherein the adjust buffer has a value which is decreased when the output voltage signal asserts a pulse, until reaching a predetermined minimum value, and a value which is increased when the output clock signal asserts a pulse until reaching a predetermined maximum value. The down-counter is driven by the first clock signal to perform a counting operation for generating the output clock signal, wherein the down-counter is loaded with a count value determined by c, a, and b, based on the adjust signal and the feedback of the output clock signal when a zero value is reached in the down-counter, thereby adjusting the output clock signal to reduce jitter.

Other objects, advantages, and novel features of the invention will become more apparent from the following detailed description when taken in conjunction with the accompanying drawings.

BRIEF DESCRIPTION OF THE DRAWINGS

FIG. 2 shows the conditions to load a down-counter of the low jitter fractional divider with low circuit speed constraint in accordance with the present invention;

DETAILED DESCRIPTION OF THE PREFERRED EMBODIMENT

Figure 1:
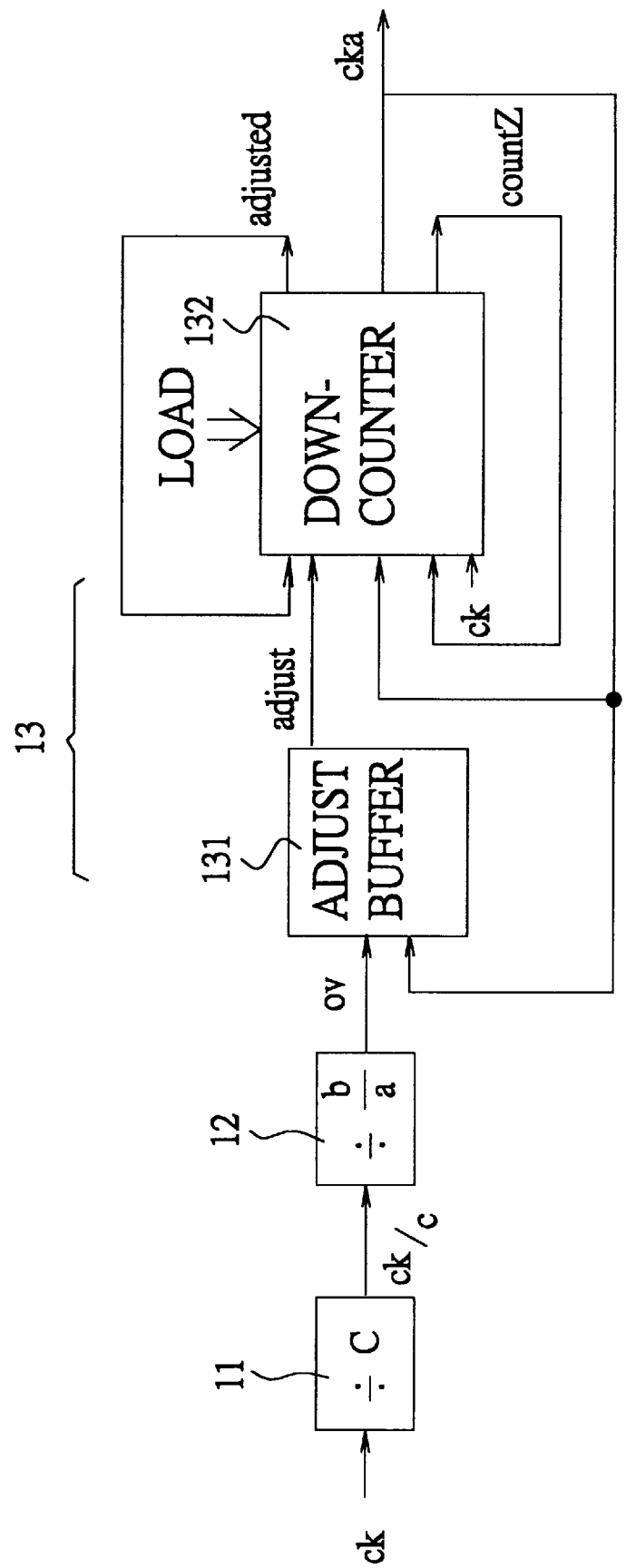
FIG. 1 is a system block diagram of a low jitter fractional divider with low circuit speed constraint in accordance with the present invention.

With reference to FIG. 1, the system block diagram of a low jitter fractional divider with low circuit speed constraint in accordance with the present invention is shown, which includes a divider 11, a fractional divider 12, and a compensation circuit 13. The divider 11 is provided to divide the frequency of an input clock signal "ck" by an integer number "c" to obtain a frequency-divided clock signal "ck/c". The fractional divider 12 divides the frequency of the frequency-divided clock signal "ck/c" by a fraction number "b/a" to obtain an output voltage signal "ov". This output voltage signal "ov" has a higher jitter because it is obtained by dividing "b/a" in low frequency. Thus, the output voltage signal "ov" must be subsequently processed by the compensation circuit 13 in order to have a jitter approximately equal to that occurred in high frequency.

The compensation circuit 13 includes an adjust buffer 131 and a down-counter 132 for receiving the output voltage signal "ov" to generate an output clock signal "cka" with low jitter. The adjust buffer 131 is provided to count the number of pulses in the output voltage signal "ov" and the feedback of the output clock signal "cka" for generating an adjust signal "adjust". The counting manner is such that the value of the adjust buffer 131 is increased by 1, whenever a pulse in the output clock signal "cka" is present, until reaching a predetermined maximum value $A_{max}$, and the value of the adjust buffer 131 is decreased by 1, whenever a pulse in the output voltage signal "ov" is present, until reaching a predetermined minimum value $A_{min}$. After reaching the maximum value $A_{max}$ or minimum value $A_{min}$, the adjust buffer 131 will not be increased or decreased even if there are pulses present in the output clock signal "cka" or output voltage signal "ov".

When the value of the adjust buffer 131 is equal to the minimum value $A_{min}$, the adjust signal "adjust" generated by the adjust buffer 131 is at a low logic level. On the contrary, when the value of the adjust buffer 131 is a value other than the minimum value $A_{min}$, the adjust signal "adjust" is at a high logic level.

The down-counter 132 is driven by the input clock signal "ck" for performing a counting operation to generate an internal adjusted signal "adjusted" and a count zero signal "countZ", which are provided to indicate that the output clock signal "cka" has been adjusted in a specific operation cycle and the down-counter 132 has counted to zero, respectively.

In general, the down-counter 132 is driven by the input clock signal "ck" to count downwardly. When the down-counter 132 counts to zero and the count zero signal "countZ" is at high logic level, a load operation is conducted based on the condition as shown in FIG. 2. That is, under the condition of the count zero signal "countZ" being at a high logic level, the adjust signal "adjust" being at a high logic level, the output clock signal "cka" being at low logic level, and the adjusted signal "adjusted" being at low logic level, the down-counter 132 is loaded with zero and the adjusted signal "adjusted" is set to high logic level, while the output clock signal "cka" remains unchanged. Under the condition of the count zero signal "countZ" being at high logic level, the output clock signal "cka" being at low logic level, and the adjusted signal "adjusted" being at high logic level, the down-counter 132 is loaded with a high logic level count value "countH" and the adjusted signal "adjusted" is set to low logic level, while the output clock signal "cka" is set to high logic level. Furthermore, under the condition of the count zero signal "countZ" being at high logic level and the output clock signal "cka" being also at high logic level, the down-counter 132 is loaded with a low logic level count value "countL" and the output clock signal "cka" is set to low logic level, while the adjusted signal "adjusted" remains unchanged.

The aforementioned high logic level count value "countH" and low logic level count value "countL" can be determined by the following expression:

$$\text{countL}=\lfloor\lfloor(c*b)/a\rfloor/2\rfloor, \text{countH}=\lfloor(c*b)/a\rfloor - \text{countL},$$

or $$\text{countH}=\lfloor\lfloor(c*b)/a\rfloor/2\rfloor, \text{countL}=\lfloor(c*b)/a\rfloor - \text{countH},$$

wherein $\lfloor X \rfloor$ represents a function of taking the integer portion of X.

The low jitter fractional divider with low circuit speed constraint in accordance with the present invention performs a jitter compensation with the use of the adjust buffer 131 and the down-counter 132. Practically, with reference to FIG. 1 and FIG. 2, the output voltage signal "ov" is the output of fractional divider 12, and the output clock signal "cka" is a clock signal of the output voltage signal "ov" after being jitter-compensated. Therefore, each pulse in the output voltage signal "ov" must have a corresponding pulse in the output clock signal "cka". Accordingly, the value of the adjust buffer 131 is zero if the numbers of these two pulses are equal. Otherwise, the value of the adjust buffer 131 is a positive integer number. When the adjust signal "adjust" is at low logic level, the duration of the output clock signal "cka" at high logic level is equal to the value of "countH" times the cycle time of the input clock signal "ck". If such a status is kept, the number of pulses in the output clock signal "cka" will gradually exceed that in the output voltage signal "ov", because (c*b)/a>countH+countL. In other words, the value of the adjust buffer 13 1 becomes non-zero and the adjust signal "adjust" becomes high logic level. At this time, an adjustment is performed on the output clock signal "cka", in which the duration of the output clock signal "cka" at high logic level is still equal to the value of "countH" times the cycle of the input clock signal "ck", and the duration of the output clock signal "cka" at low logic level is equal to the value of "countL"+1 times the cycle time of the input clock signal "ck". Such adjustment will increase the number of pulses in the output voltage signal "ov", thereby decreasing the value of the adjust buffer 131.

The adjusted signal "adjusted" provided to control the adjusted duration of the output clock signal "cka" at low logic level is obtained from a value of ("countL"+1), instead of ("countL"+i), where i>1, so that the jitter of the output clock signal "cka" can be limited to one cycle of the input clock signal "ck".

Figure 3:
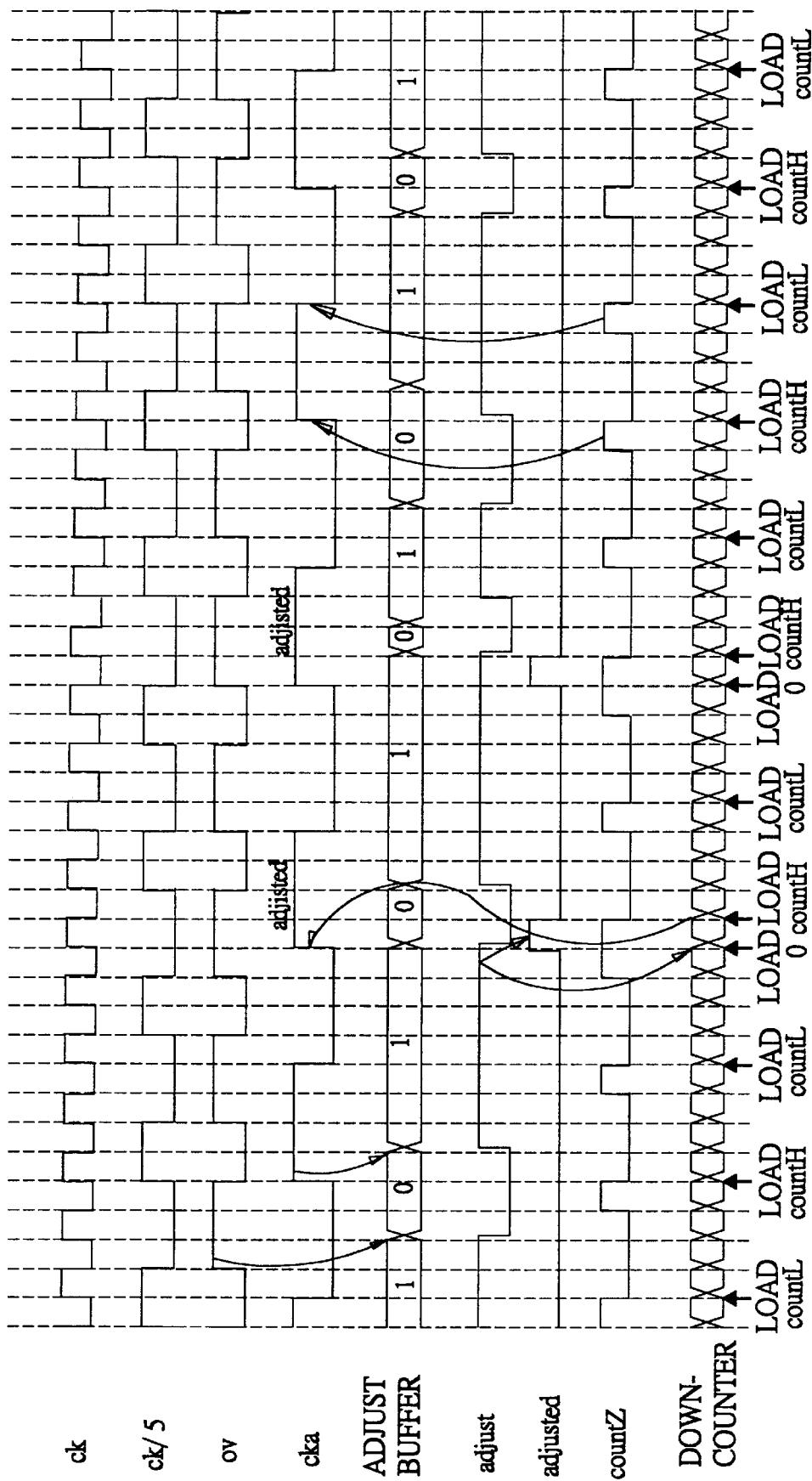
FIG. 3 is a timing diagram showing an exemplary operation of the low jitter fractional divider with low circuit speed constraint in accordance with the present invention.
Figure 4:
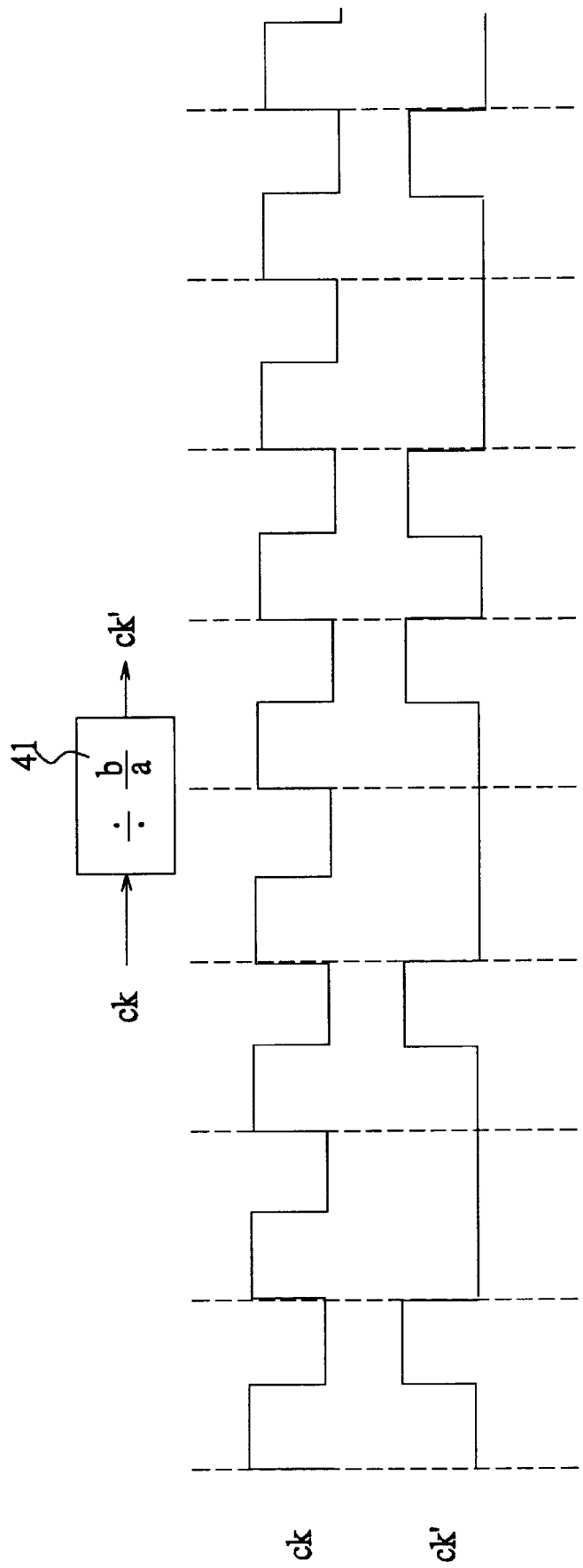
FIG. 4 shows a conventional fractional divider and an exemplary timing diagram thereof.

FIG. 3 is an exemplary timing diagram for the low jitter fractional divider with low circuit speed constraint in accordance with the present invention, wherein c=5, b=5 and a=3. The adjust buffer 131 is preferred to be a two-bit buffer, such that $A_{max}=3$, $A_{min}=0$, countH=$\lfloor\lfloor(5*5)/3\rfloor/2\rfloor$=4, and countL=4. It is shown that, after being adjusted, the jitter of the output clock signal "cka" has been significantly decreased, thereby completely eliminating the problems in speed and jitter of a fractional divider.

While the invention herein disclosed has been described by means of specific embodiments, numerous modifications and variations could be made thereto by those skilled in the art without departing from the scope of the invention set forth in the claims.

What is claimed is:

1. A low jitter fractional divider with low circuit speed constraint, comprising:

a divider for dividing the frequency of an input first clock signal by an integer number c to obtain a second clock signal;

a fractional divider for dividing said frequency of said second clock signal by a fraction number b/a to obtain an output voltage signal;

a compensation circuit for receiving said output voltage signal to generate an output clock signal with relatively low jitter, said compensation circuit comprising:

an adjust buffer for generating an adjust signal based on said output voltage signal and a feedback of said output clock signal, wherein said adjust buffer has a value which is decreased when said output voltage signal asserts a pulse until reaching a predetermined minimum value, and which is increased when said output clock signal asserts a pulse until reaching a predetermined maximum value; and a down-counter driven by said first clock signal to perform a counting operation for generating said output clock signal, wherein said down-counter is loaded with a count value determined by said c, a, and b, based on said adjust signal and the feedback of said output clock signal when a zero value is reached in said down-counter, thereby adjusting said output clock signal to reduce jitter.

2. The low jitter fractional divider with low circuit speed constraint as claimed in claim 1, wherein said adjust signal is at a first logic level when the value of said adjust buffer is equal to said minimum value, and otherwise, said adjust signal is at a second logic level.

3. The low jitter fractional divider with low circuit speed constraint as claimed in claim 2, wherein said down-counter generates an internal adjusted signal and a count zero signal to indicate that said output clock signal has been adjusted and said down-counter has counted to zero, respectively, thereby performing a load operation in such a manner that under a condition of said count zero signal being at second logic level, said adjust signal being at second logic level, said output clock signal being at first logic level, and said adjusted signal being at second logic level, said down-counter is loaded with a zero and said adjusted signal is set to second logic level; under a condition of said count zero signal being at second logic level, said output clock signal being at first logic level, and said adjusted signal being at second logic level, said down-counter is loaded with a second logic level count value determined by said a, b, and c and said adjusted signal and said output clock signal are set to first logic level and second logic level, respectively; and under a condition of said count zero signal being at second logic level and said output clock signal being at second logic level, said down-counter is loaded with a first logic level count value determined by said a, b, and c, and said output clock signal is set to first logic level; while said count zero signal is set to second logic level when the value of said down-counter is zero.

4. The low jitter fractional divider with low circuit speed constraint as claimed in claim 3, wherein said first logic level count value is equal to $\lfloor \lfloor (c*b)/a \rfloor /2 \rfloor$ and said second logic level count value is equal to $\lfloor (c*b)/a \rfloor$ subtracted by said first logic level count value, while $\lfloor \ \rfloor$ represents a function of taking an integer value.

5. The low jitter fractional divider with low circuit speed constraint as claimed in claim 3, wherein said second logic level count value is equal to $\lfloor \lfloor (c*b)/a \rfloor /2 \rfloor$ and said first logic level count value is equal to $\lfloor (c*b)/a \rfloor$ subtracted by said second logic level count value, while $\lfloor \ \rfloor$ represents a function of taking an integer value.

6. The low jitter fractional divider with low circuit speed constraint as claimed in claim 4, wherein said first logic level is a low logic level and said second logic level is a high logic level.

7. The low jitter fractional divider with low circuit speed constraint as claimed in claim 5, wherein said first logic level is a low logic level and said second logic level is a high logic level.

8. The low jitter fractional divider with low circuit speed constraint as claimed in claim 4, wherein said adjust buffer is an N-bit buffer.

9. The low jitter fractional divider with low circuit speed constraint as claimed in claim 5, wherein said adjust buffer is an N-bit buffer.

10. The low jitter fractional divider with low circuit speed constraint as claimed in claim 8, wherein said predetermined minimum value is zero and said predetermined maximum value is $2^N-1$.

11. The low jitter fractional divider with low circuit speed constraint as claimed in claim 9, wherein said predetermined minimum value is zero and said predetermined maximum value is $2_N-1$.

* * * * *